US009503086B1

(12) United States Patent
Klass (10) Patent No.: US 9,503,086 B1
(45) Date of Patent: Nov. 22, 2016

(54) LOCKUP LATCH FOR SUBTHRESHOLD OPERATION

(71) Applicant: Apple Inc., Cupertino, CA (US)

(72) Inventor: Edgardo F. Klass, Palo Alto, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 14/855,507

(22) Filed: Sep. 16, 2015

(51) Int. Cl.
| H03K 3/00 | (2006.01) |
| H03K 19/00 | (2006.01) |
| H03K 3/037 | (2006.01) |
| H03K 17/30 | (2006.01) |

(52) U.S. Cl.
CPC .......... *H03K 19/0016* (2013.01); *H03K 3/037* (2013.01); *H03K 17/302* (2013.01)

(58) Field of Classification Search
CPC .............. H03K 3/012; H03K 3/0375; H03K 3/35625; H03K 3/037
USPC ................. 327/199–203, 215, 218, 219, 225
See application file for complete search history.

(56) References Cited

U.S. PATENT DOCUMENTS

| 8,587,356 | B2 * | 11/2013 | Zhang | .............. | H03K 3/356008 327/218 |
| 8,736,332 | B2 * | 5/2014 | Sriadibhatla | ....... | H03K 19/0008 327/199 |
| 2011/0148496 | A1 * | 6/2011 | Sriadibhatla | ....... | H03K 19/0008 327/202 |

OTHER PUBLICATIONS

Bo Zhai et al., "Theoretical and Practical Limits of Dynamic Voltage Scaling," University of Michigan, Ann Arbor, MI; ARM Ltd., Cambridge, UK, DAC '04, Jun. 7-11, 2004, San Diego, CA., pp. 6.
Bo Zhai et al., "A Variation-Tolerant Sub-200 mV 6-T Subthreshold SRAM," IEEE Journal of Solid-State Circuits, vol. 43, No. 10, Oct. 2008, pp. 2338-2348.
S. Hanson et al., "Ultralow-voltage, minimum-energy CMOS," IBM J. Res. & Dev. ,vol. 50 ,No. 4/5, Jul./Sep. 2006, pp. 469-490.
Nele Reynders and Wim Dehaene, "A 190mV supply, 10MHz, 90nm CMOS, Pipelined Sub-Threshold Adder using Variation-Resilient Circuit Techniques", Heverlee, Belgium, Proceedings of IEEE Asian Solid-State Circuits Conference (A-SSCC), 2011, pp. 113-116, http://dx.doi.org/10.1109/ASSCC.2011.6123617.
Nele Reynders and Wim Dehaene, "Variation-Resilient Sub-Threshold Circuit Solutions for Ultra-Low-Power Digital Signal Proces

(Continued)

*Primary Examiner* — Long Nguyen
(74) *Attorney, Agent, or Firm* — Meyertons, Hood, Kivlin, Kowert & Goetzel, P.C.; Lawrence J. Merkel (57) ABSTRACT

In an embodiment, an integrated circuit may include edge triggered flops that launch data to start a clock cycle and that capture data at the end of the clock cycle. Combinatorial logic circuitry may be coupled between the launching and capturing flops, and may be configured to operate on the launched data to generate result data for the capturing flops. One or more latches may be provided in the combinatorial logic circuitry, which may close and capture intermediate values responsive to an opposite edge of the clock than the edge that triggers the edge-triggered flops. In an embodiment, the clock to the latches may be gated with an enable. When the integrated circuit is not operating in the subthreshold voltage region, the enable may be in the disabled state. When operating in the subthreshold voltage region, the enable may be in the enabled state.

20 Claims, 5 Drawing Sheets

(56) References Cited

OTHER PUBLICATIONS sors with 10MHz Clock Frequency," Heverlee, Belgium, Proceedings of IEEE European Solid-State Circuits Conference (ESSCIRC), 38, 2012, pp. 474-477, http://dx.doi.org/10.1109/ESSCIRC.2012.6341358.

Scott Hanson et al., "Nanometer Device Scaling in Subthreshold Logic and SRAM," IEEE Transactions on Electron Devices, vol. 55, No. 1, Jan. 2008, pp. 175-185.

Dongsuk Jeon et al., "A Super-Pipelined Energy Efficient Subthreshold 240 MS/s FFT Core in 65 nm CMOS," IEEE Journal of Solid-State Circuits, vol. 47, No. 1, Jan. 2012, pp. 23-34.

Bo Zhai et al., "A 2.60pJ/Inst Subthreshold Sensor Processor for Optimal Energy Efficiency," University of Michigan, Ann Arbor, MI, 2006, pp. 2.

Scott Hanson et al., "Performance and Variability Optimization Strategies in a Sub-200mV, 3.5pJ/inst,11nW Subthreshold Processor," University of Michigan, Ann Arbor, MI, 2006, pp. 2.

* cited by examiner

LOCKUP LATCH FOR SUBTHRESHOLD OPERATION

BACKGROUND

Technical Field

Embodiments described herein are related to circuits and methods for operating integrated circuits in subthreshold voltage regions.

Description of the Related Art

The increasing popularity of mobile devices continues to drive the trend toward low power designs. Mobile devices are often operated on a limited energy supply such as a battery, as opposed to the essentially unlimited energy supply of a wall plug. To provide long battery life, low power consumption in the device is key.

Voltage scaling is one mechanism for lowering power consumption/energy use in an integrated circuit. Because power consumption increases with the square of the supply voltage magnitude, reductions in supply voltage magnitude provide quadratic reductions in power consumption. In the past, the limit to voltage scaling has been based on the threshold voltage of the transistors in the design. Generally, the threshold voltage is the gate-to-source voltage that is necessary to reach saturation current in the transistor. Below the threshold voltage, current varies significantly with variation in the gate-to-source voltage. Above the threshold voltage, the current can still vary with gate-to-source voltage but the variation is much smaller. Operating in the saturation region simplifies the timing analysis of the design.

More recently, scaling the supply voltage magnitude near the threshold voltage or even below the threshold voltage has been investigated. Operation in this region is challenging to traditional circuit designs. For example, if the threshold voltage of a transistor is 200 mV+/−50 mV and the supply voltage is 600 mV, the excess of the supply voltage over the threshold voltage ("headroom") is between 350-450 mV, or a variation of about +/−10%. In the saturation region, a variation of 10% in the gate to source voltage generally has a minor effect on circuit delay. If the supply voltage is to be 300 mV, the headroom is between 50-150 mV, or +/−50%. Such a variation can cause more significant timing problems. If the supply voltage is reduced into the subthreshold voltage region, variations in current are much more pronounced even for small variations in the threshold voltage, dramatically impacting delays in the circuit.

Traditionally, operation near or in the threshold voltage region has been accomplished by redesigning the circuit library available to the designer and/or logic synthesis tools, to limit the number of transistors in a "stack" (e.g. the N-type metal-oxide-semiconductor (NMOS) transistors in a traditional NAND gate) and using alternative circuit designs for gates in the library. The process of limiting and changing the library is referred to as pruning Once the library is pruned, the integrated circuit design must be resynthesized and retimed. Pruning, resynthesis, and retiming all take additional effort and time and may cause additional problems within the integrated circuit.

SUMMARY

In an embodiment, an integrated circuit may include logic circuitry that is designed to operate at or near a subthreshold voltage region. The circuitry may include edge triggered flops that launch data to start a clock cycle and that capture data at the end of the clock cycle. Combinatorial logic circuitry may be coupled between the launching and capturing flops, and may be configured to operate on the launched data to generate result data for the capturing flops. One or more latches may be provided in the combinatorial logic circuitry, which may close and capture intermediate values responsive to an opposite edge of the clock than the edge that triggers the edge-triggered flops. The latches may prevent shorter paths between the flops from racing through the logic and capturing incorrect data at the end of the clock cycle, without requiring buffering to be inserted in the path (which might slow down too much in the subthreshold region, causing the path to fail timing because it is too slow).

In an embodiment, the clock to the latches may be gated with an enable. When the integrated circuit is not operating in the subthreshold voltage region, the enable may be in the disabled state and the clock to the latch may not toggle, saving power. The latch may be maintained in the open state when the clock is disabled, allowing data to flow through the latch. When operating in the subthreshold voltage region, the enable may be in the enabled state and the clock may operate on the latch, opening and closing the latch each clock cycle. Additionally, the circuit library used to design/ synthesize the integrated circuit need not be pruned for subthreshold region operation.

BRIEF DESCRIPTION OF THE DRAWINGS

The following detailed description makes reference to the accompanying drawings, which are now briefly described.

While embodiments described in this disclosure may be susceptible to various modifications and alternative forms, specific embodiments thereof are shown by way of example in the drawings and will herein be described in detail. It should be understood, however, that the drawings and detailed description thereto are not intended to limit the embodiments to the particular form disclosed, but on the contrary, the intention is to cover all modifications, equivalents and alternatives falling within the spirit and scope of the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include", "including", and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits and/or memory storing program instructions executable to implement the operation. The memory can include volatile memory such as static or dynamic random access memory and/or nonvolatile memory such as optical or magnetic disk storage, flash memory, programmable read-only memories, etc. The hardware circuits may include any combination of combinatorial logic circuitry, clocked storage devices such as flops, registers, latches, etc., finite state machines, memory such as static random access memory or embedded dynamic random access memory, custom designed circuitry, programmable logic arrays, etc. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112(f) interpretation for that unit/circuit/component.

In an embodiment, hardware circuits in accordance with this disclosure may be implemented by coding the description of the circuit in a hardware description language (HDL) such as Verilog or VHDL. The HDL description may be synthesized against a library of cells designed for a given integrated circuit fabrication technology, and may be modified for timing, power, and other reasons to result in a final design database that may be transmitted to a foundry to generate masks and ultimately produce the integrated circuit. Some hardware circuits or portions thereof may also be custom-designed in a schematic editor and captured into the integrated circuit design along with synthesized circuitry. The integrated circuits may include transistors and may further include other circuit elements (e.g. passive elements such as capacitors, resistors, inductors, etc.) and interconnect between the transistors and circuit elements. Some embodiments may implement multiple integrated circuits coupled together to implement the hardware circuits, and/or discrete elements may be used in some embodiments. Alternatively, the HDL design may be synthesized to a programmable logic array such as a field programmable gate array (FPGA) and may be implemented in the FPGA.

This specification includes references to "one embodiment" or "an embodiment." The appearances of the phrases "in one embodiment" or "in an embodiment" do not necessarily refer to the same embodiment, although embodiments that include any combination of the features are generally contemplated, unless expressly disclaimed herein. Particular features, structures, or characteristics may be combined in any suitable manner consistent with this disclosure.

DETAILED DESCRIPTION OF EMBODIMENTS

Figure 1:
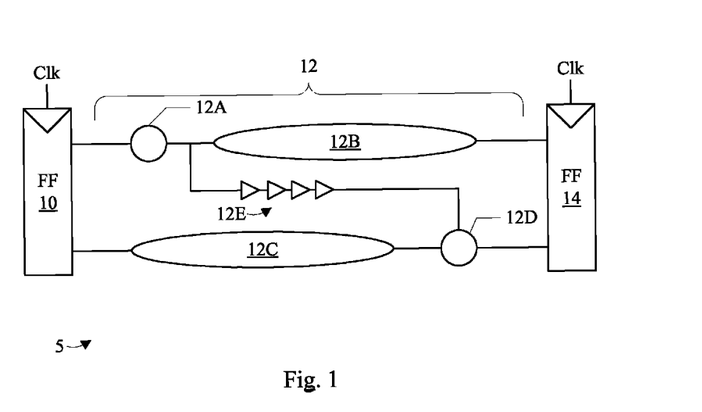
FIG. 1 is a block diagram of one embodiment of logic circuitry.

FIG. 1 is a block diagram of one embodiment of logic circuitry 5. The circuitry 5 shown in FIG. 1 may be one pipeline stage in a pipeline implemented in an integrated circuit, for example. The embodiment of FIG. 1 includes one or more flip flop circuits (flops) 10 coupled to a clock signal and configured to launch data (e.g. one or more digital bits) into combinatorial logic circuitry 12. Accordingly, the flops 10 may be referred to as launch flops. The combinatorial logic circuitry 12 may be coupled to the flops 10 and may be configured to operating on the launched data, generating result data (e.g. one or more digital bits). The result data may be captured by one or more flops 14, which are also coupled to the clock signal. Accordingly, the flops 14 may be referred to as capture flops.

The flops 10 and 14 may be D-type flip-flops. A D-type flip-flop is configured to capture an input value responsive to a clock edge and to launch the captured value on an output responsive to that clock edge. That is, the data to be captured may be expected to meet a setup and hold time around the clock edge, during which the captured data is expected to be stable. In the illustrated embodiment, the flops 10 and 14 may be configured to capture and launch data responsive to the rising clock edge (i.e. low to high transition on the clock input). Other embodiments may be configured to capture and launch on the falling clock edge (i.e. high to low transition). Capturing data may refer to storing the data in the flop (or any other storage device) so that it will remain stable until the next occurrence of a clock edge that causes capture. Launching data may refer to driving the data on the output of the flop (or any other storage device). Flops and other edge-triggered storage devices may capture and launch data at the edge (e.g. the data need only be stable for the setup and hold time around the clock edge). On the other hand, latches and other phase-triggered storage device may be open during one phase of the clock (e.g. the low phase, or the high phase) and closed during the other phase. Data may change state at any point in the open phase and may be captured and launched at the time it changes during the open phase. Data may even change more than once while the latch is open. During the closed phase, the captured data is held stable, independent of changes on the input to the latch. Generally, a clocked storage device may capture and launch data responsive to a clock input (edge-triggered or phase triggered). The flops may be example of clocked edge-triggered storage device and latches may be an example of a clocked phase-triggered storage device.

The combinatorial logic circuitry 12 may include various sets of logic gates that form paths from inputs to outputs. Each path may have a certain amount of delay, dependent on the logic gate circuit design, the number of gates in the path, etc. Relative delays are illustrated in FIG. 1 via the width of the circles/ovals. Thus, circuitry 12A may have a relatively shorter delay than the circuit 12B. Similarly, the circuit 12C may have a relatively shorter delay than the circuit 12D. The total delay from data launched from a flop 10 to a result flop 14 may determine the maximum frequency at which the clock signal may toggle. For example, if the longest delay is from the output of the flop 10 through circuits 12A and 12B to the result data input to the flop 14, that clock period may be no shorter than that delay and this the frequency may be no higher than the inverse of the delay through the circuits 12A and 12B.

On the other hand, short paths (short delays) may also be a challenge for timing in the design. For example, the delay through the path from circuit 12A to 12D may be relatively short. In some cases, the delay of the launched data from the flop 10 through the short path to the capture flop 14 may be short enough to violate the hold time on the capture flop 14. That is, a value could be launched on a clock edge, race through the circuits 12A-12D, and be captured by the capture flop 14 on that same clock edge. Such a result would be incorrect.

Circuits designed to operate with supply voltages above the threshold voltage of the transistors ("superthreshold" voltage region) may address short paths by adding buffer circuitry within the path, e.g. buffers 12E in FIG. 1. The buffers add delay to the path without actually changing the logical value being generated. That is, the output of the buffers 12E may be the same logical state as the input, delayed in time. However, for subthreshold voltage operation, adding length to the path (which may vary in delay significantly depending on the variations in the actual threshold voltage and other factors) may not be as desirable.

Figure 2:
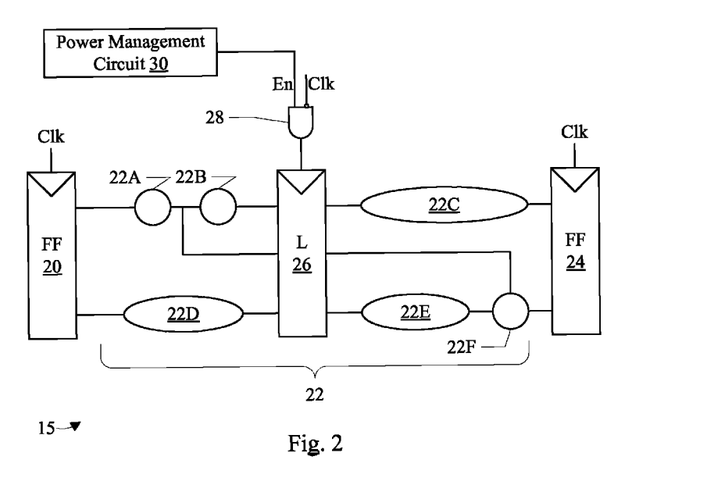
FIG. 2 is a block diagram of another embodiment of logic circuitry include one or more latches.

FIG. 2 is a block diagram illustrating another embodiment of logic circuitry 15. The embodiment of FIG. 2 includes one or more launch flops 20, combinatorial logic circuitry 22, and one or more capture flops 24. The launch flops 20 and capture flops 24 are coupled to the clock signal and may be rising-edge triggered, in an embodiment. Other embodiments may be falling-edge triggered. The launch flops 20 have outputs coupled to the combinatorial logic circuitry 22, which may generate result data on the inputs of the capture flops 24. The combinatorial logic circuits include various circuits 22A-22F, with the width of the circles/ovals indicating relative delay as in FIG. 1. Additionally, one or more latches 26 are included within the combinatorial logic circuit 22.

The latches 26 may be open in one phase of the clock, allowing data to pass through the latches and transparently capturing the data. The latches 26 may be closed in the opposite phase, holding the data that was captured in the open phase. In an embodiment the latches 26 closes on the falling edge of the clock signal. That is, the latches 26 may be open in the high phase of the clock and closed in the low phase. Thus, the latches 26 open approximately at the same time as the launch flops 20 launch data, and closes approximately ½ clock later. Viewed in another way, the latch may be open during the first half of the clock cycle of the clock that launches the data and may be closed in the second half of the clock cycle.

For paths that have relatively short delays, such as circuit 22A to circuit 22F in FIG. 2, the latches 26 may capture data and close before the next data is launched by the launch flops 20, which may prevent the race of data through the small delay path and possible incorrect operation. Additionally, the race condition may be prevented without the addition of a significant number of buffers in the path.

The embodiment of FIG. 2 may be used for supply voltages in the subthreshold voltage region where delays in the circuits may be expected to vary more widely, since the solution may prevent race conditions with fewer delays. Latches 26 are sometimes referred to as lockup latches. Generally, the latches 26 may be configured to capture various intermediate results generated in the combinatorial logic circuitry 22. The intermediate results may be generated in the first half of the clock cycle and held by the latches 26 for the second half of the clock cycle.

In an embodiment, the clock to the flops 20 and 24 and to the latches 26 may be in-phase with each other and may simply be a single clock. The complexities of routing non-overlapping clocks to blocks that include the latches may be avoided, simplifying the circuit and reducing power.

In an embodiment, the latches 26 may support a gated clock illustrated by AND gate 28. Other embodiments may not implement the gated clock. The enable for the gate clock may be in the enabled state (e.g. asserted) if the circuitry in FIG. 2 is being operated in the subthreshold voltage region. If the circuitry is being operated in the superthreshold voltage region, the enable may be in the disabled state (e.g. deasserted). When the enable is in the disabled state, the latches 26 may be open and thus data may pass through the latches 26 at any point in time. Accordingly, in superthreshold voltage operation, the power for clocking the latches 26 may be conserved since its function may not be required. Gated clocking may be used in cases in which the number of latches 26 included in the design is large and thus the power consumed (and conserved when disabled) may be significant. A power management circuit 30 shown in FIG. 2 may be coupled to the enable input to the AND gate 28 and may be configured to control the enable state on the enable input. The power management circuit 30 may further be configured to generate supply voltage requests indicating the desired supply voltage magnitude to be supplied to the circuitry shown in FIG. 2. If the power management circuit 30 is generating supply voltage requests in the subthreshold voltage region, the power management circuit 30 may be configured to generate the enable in the enabled state. If the power management circuit 30 is generating supply voltage requests in the superthreshold voltage region, the power management circuit 30 may generate the enable in the disabled state.

It is noted that, while flops 10 and 20 are referred to as launch flops, these flops may also serve as capture flops for other combinatorial logic circuitry coupled to the inputs of the flops (not shown in FIGS. 1 and 2). Similarly, flops 14 and 24 are referred to as capture flops with respect to the combinatorial logic circuitry 12 and 22 shown in FIGS. 1 and 2, but may also serve as launch flops to other combinatorial logic circuitry (not shown in FIGS. 1 and 2). The circuitry shown in FIG. 1 and in FIG. 2 may, for example, be a pipeline stage in a pipeline of an integrated circuit.

Figure 3:
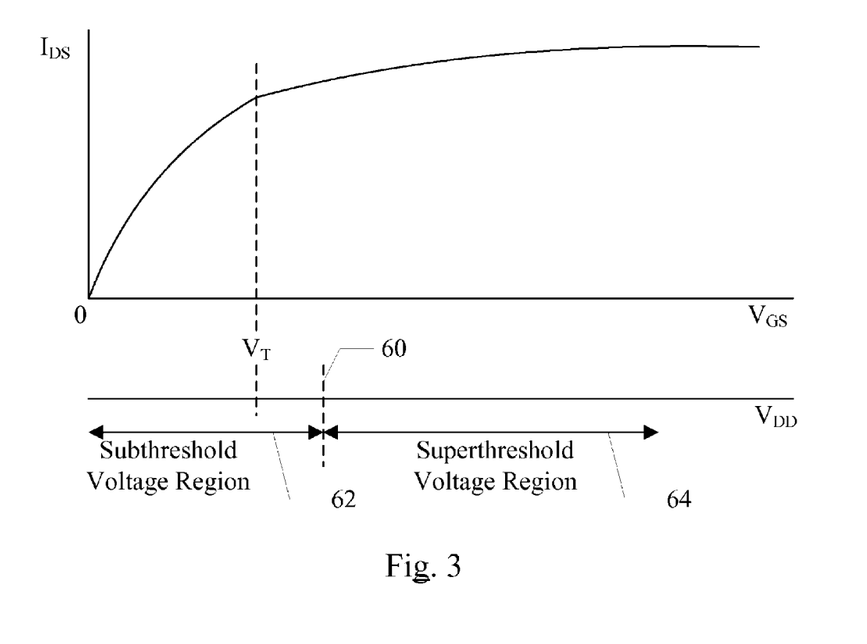
FIG. 3 is an I-V curve for an embodiment of a transistor and an illustration of subthreshold and superthreshold supply voltage magnitudes for an embodiment.

FIG. 3 is an I-V curve for a transistor, for one embodiment. The vertical axis of the graph is the current from drain to source ($I_{DS}$) and the horizontal axis of the graph is the gate to source voltage ($V_{GS}$). Beginning with a gate to source voltage of zero, the current increases as the voltage increases at a significant rate (slope) until the gate to source voltage reaches the threshold voltage of the transistor ($V_T$). As the gate to source voltage continues to increase above $V_T$, the current may continue to increase as well but the slope of the curve (the rate of increase in the current) may decrease significantly, to almost flat. That is, the transistor may reach saturation at the threshold voltage, and the current increase may be relatively small once saturation is reached.

The supply voltage magnitude ($V_{DD}$) is also illustrated in FIG. 3 on the same scale as the gate to source voltage ($V_{GS}$). A dotted line 60 separates a subthreshold voltage region of the supply voltage (arrow 62) from the superthreshold voltage region (arrow 64). The supply voltage magnitude that is less than or equal to $V_T$ is part of the subthreshold voltage region. Additional magnitudes above $V_T$ may also be part of the subthreshold voltage region, in some embodiments. For example, a percentage of $V_T$ may be added to $V_T$ to demarcate the subthreshold voltage region from the superthreshold voltage region, since most of the signal swing on gate to source voltage may be at or below $V_T$ for supply voltage magnitudes in that range above $V_T$. For example, 10-20% may be used. Alternatively, a number of millivolts (mV) above $V_T$ may be used. The number of mV may be based on the variation in $V_T$ that may occur in manufacturing. The number of mV may equal the variation, or may be a multiple of the variation. For example, 1-3 times the variation may be selected. For a variation of +/−50 mV, 50-150 mV may be selected. The portion of the voltage range that is not the subthreshold voltage region may be the superthreshold voltage region.

Figure 4:
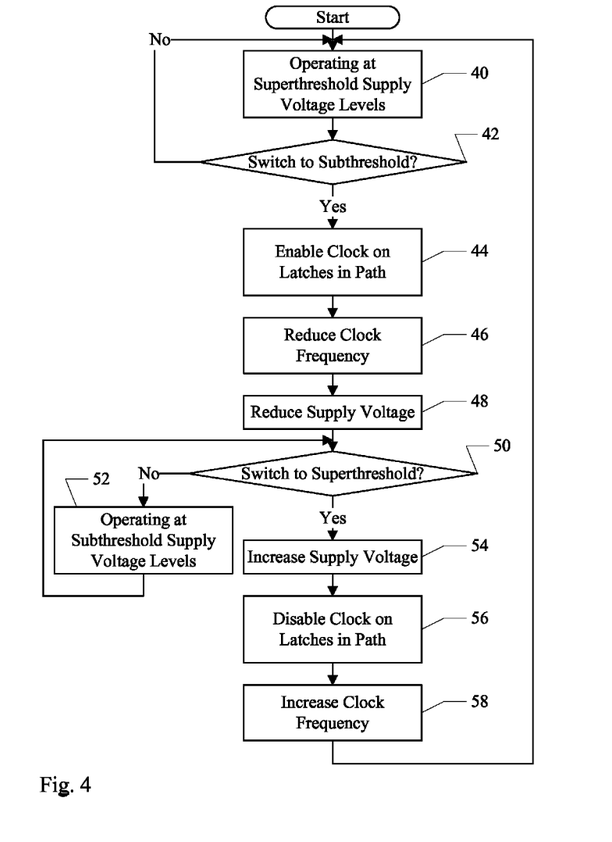
FIG. 4 is a flowchart illustrating operation of one embodiment of the circuitry shown in FIG. 2.

FIG. 4 is a flowchart illustrating operation of one embodiment of the power management circuit 30 in FIG. 2. While the blocks are shown in a particular order for ease of understanding, other orders may be used. Blocks may be performed in combinatorial logic circuitry in the power management circuit 30. Blocks, combinations of blocks, and/or the flowchart as a whole may be pipelined over multiple clock cycles. The power management circuit 30 may be configured to implement the operation shown in FIG. 4.

At the beginning of the flowchart in FIG. 4, the power management circuit 30 may be operating the circuitry at superthreshold supply voltage levels, e.g. within the superthreshold voltage region 64 shown in FIG. 3 (block 40). The power management circuit 30 may support multiple supply voltage magnitudes in the superthreshold voltage region 64. Changes among those magnitudes may not affect the operation of the latches 26 (other than relative delay, as with other circuitry in the integrated circuit), and steady state operation at one of those magnitudes may not affect the operation of the latches 26, either (decision block 42, "no" leg). That is, the latches may remain disabled via the disabled state on the enable input. On the other hand, if a change to a supply voltage magnitude in the subthreshold voltage region 62 is to be made (decision block 42, "yes" leg), the power management circuit 30 may be configured to drive the enabled state on the enable input (block 44). The power management circuit 30 may be configured to reduce the clock frequency of the clock to the flops 20 and 24 to a frequency that will operate correctly at the decreased supply voltage magnitude (block 46) and the power management circuit 30 may be configured to reduce the supply voltage magnitude.

Unless the power management circuit 30 detects an increase in the supply voltage magnitude to the superthreshold voltage region 64, the power management circuit 30 may continue subthreshold voltage operation (decision block 50, "no" leg and block 52). The power management circuit 30 may support multiple supply voltage magnitudes in the subthreshold voltage region 62, in an embodiment. Changes among those magnitudes may not affect the operation of the latches 26 (other than relative delay, as with other circuitry in the integrated circuit), and steady state operation at one of those magnitudes may not affect the operation of the latches 26, either. That is, the latches may remain enabled via the enabled state on the enable input. On the other hand, if a change to a supply voltage magnitude in the superthreshold voltage region is to be made (decision block 50, "yes" leg), the power management circuit 30 may be configured to increase the supply voltage magnitude (block 54). Once the supply voltage magnitude has increased out of the subthreshold voltage region 62, the power management circuit 30 may be configured to change the state of the enable to the disabled state (block 56) and may increase the clock frequency (block 58).

Figure 5:
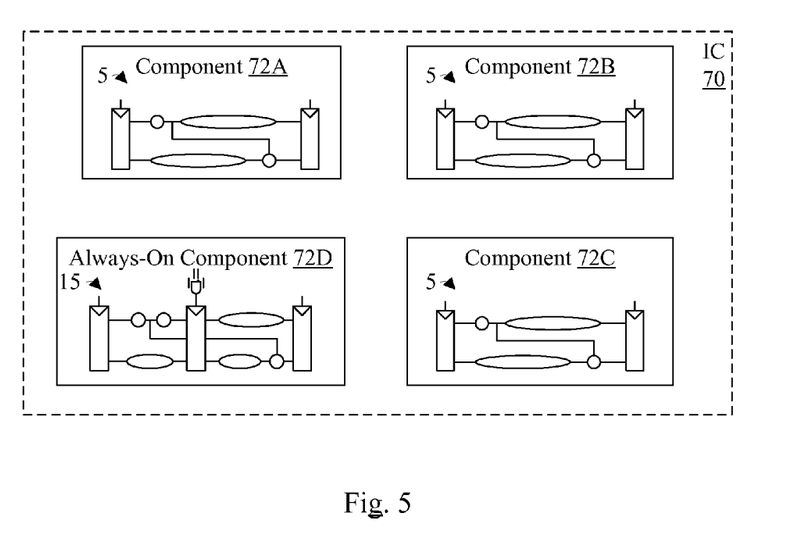
FIG. 5 is a block diagram of an integrated circuit (IC) including logic circuitry as shown in FIGS. 1 and 2.

FIG. 5 is a block diagram of an integrated circuit 70 which may implement the circuits 5 and 15. In the illustrated embodiment, the integrated circuit 70 may include one or more components such as components 72A-72C, and one or more "always-on" components such as component 72D. The components 72A-72C may include one or more circuits 5 similar to the embodiment of FIG. 1, and the component 72D may include one or more circuits 15 similar to the embodiment of FIG. 2.

In one embodiment, the components 72A-72C may be power gated components. That is, during times that the IC 70 as a whole is receiving power, the components 72A-72C may be powered up or down as desired to perform the work for which the IC 70 is designed. When workload is low or the IC 70 is idle, for example, components 72A-72C may be powered down. During times that one or more of the components 72A-72C are powered up, the IC 70 may be configured to operate in the superthreshold voltage region and thus circuits 5 may be used in those components.

The component 72D may be powered on continuously if the IC 70 is receiving power. Thus, the component 72D is labeled as "always-on". During times that the other components 72A-72C are powered up, the component 72D may operate in the superthreshold voltage region. However, at least some of the time that the components 72A-72D are powered down, the component 72D may be operated in the subthreshold voltage region. Accordingly, the component 72D may include the circuits 15 as described above.

A component may generally be any block of circuitry and corresponding set of operational features. For example, if the IC 70 is a system on a chip (SOC), the components may include one or more of processors, memory controllers, peripheral interface controllers, peripherals such as audio peripherals and video peripherals, graphics processors (GPUs), display controllers, etc.

Figure 6:
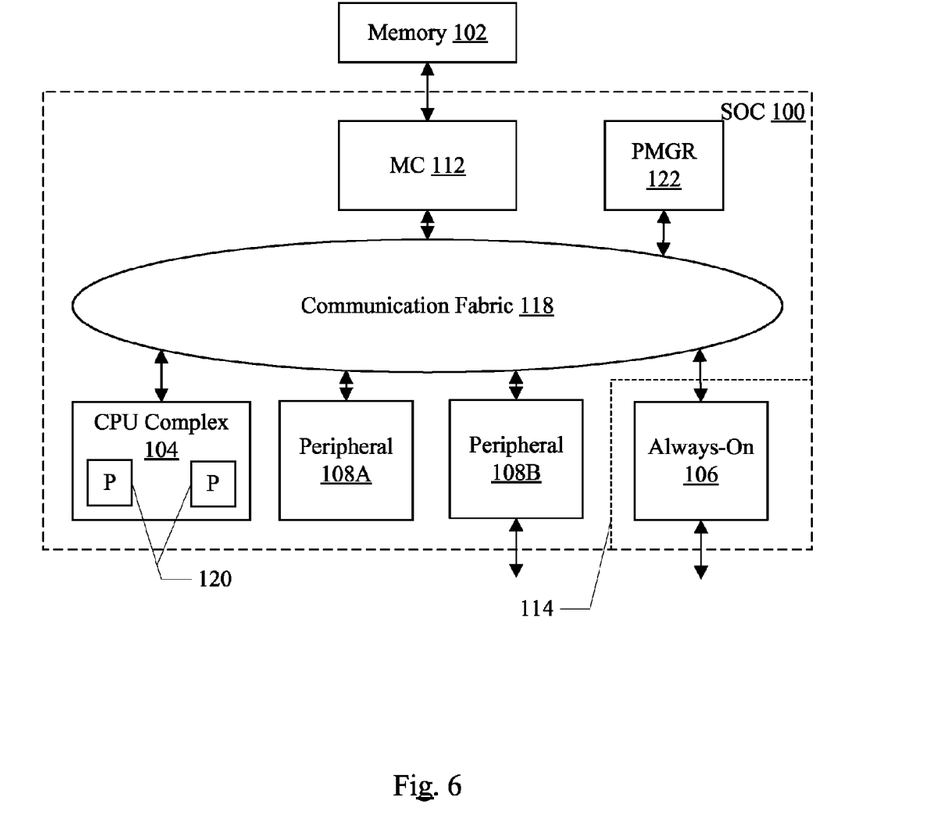
FIG. 6 is a block diagram of one embodiment of a system on a chip (SOC).

Turning now to FIG. 6, a block diagram of one embodiment of an SOC 100 is shown coupled to a memory 102. As implied by the name, the components of the SOC 100 may be integrated onto a single semiconductor substrate as an integrated circuit "chip." In some embodiments, the components may be implemented on two or more discrete chips in a system. However, the SOC 100 will be used as an example herein. In the illustrated embodiment, the components of the SOC 100 include a central processing unit (CPU) complex 104, an "always-on" component 106, peripheral components 108A-108B (more briefly, "peripherals"), a memory controller 112, a power manager (PMGR) 122, and a communication fabric 118. The components 104, 106, 108A-108B, 112, and 122 may all be coupled to the communication fabric 118. The memory controller 112 may be coupled to the memory 102 during use. In the illustrated embodiment, the CPU complex 104 may include one or more processors (P 120 in FIG. 6). The processors 120 may form the CPU(s) of the SOC 100.

The SOC 100 may be an example IC 70. The CPU complex 104, the peripherals 108A-108B, the memory controller 112, the fabric 118, and the PMGR 122 may be examples of the components 72A-72C, may include the circuitry 5. The always-one component 106 may be an example of the always-on component 72D, and may include the circuitry 15.

The always-on component 106 may be configured to remain powered up when other components of the SOC 100 (e.g. the CPU complex 104, the peripherals 108A-108B, and the PMGR 122) are powered down. More particularly, the always-on component 106 may be on whenever the SOC 100 is receiving power from the PMU 156. Thus, the always-on component is "always-on" in the sense that it may be powered if the SOC 100 is receiving any power (e.g. at times when the device including the SOC 100 is in standby mode or is operating actively), but may not be powered when the SOC 100 is not receiving any power (e.g. at times when the device is completely turned off). The always-on component 106 may support certain functions while the remainder of the SOC 100 is off, allowing low power operation.

In FIG. 6, a dotted line 114 separating the always-on component 106 from the other components may indicate an independent power domain for the always-on component 106. Generally, a power domain may be configured to receive supply voltage (i.e. be powered on) or not receive supply voltage (i.e. be powered off) independent of other power domains. In some embodiments, power domains may be supplied with different supply voltage magnitudes concurrently. The independence may be provided in a variety of fashions. For example, the independence may be provided by providing separate supply voltage to the SOC 100, by providing power switches between the supply voltage inputs and components and controlling the power switches for a given domain as a unit, and/or a combination of the above. There may be more power domains than those illustrated in FIG. 6 as well. For example, the CPU complex 104 may have an independent power domain (and each CPU processor 30 may have an independent power domain as well) in an embodiment. One or more peripheral components 108A-108B may be in one or more independent power domains in an embodiment.

As mentioned above, the CPU complex 104 may include one or more processors 30 that may serve as the CPU of the SOC 100. The CPU of the system includes the processor(s) that execute the main control software of the system, such as an operating system. Generally, software executed by the CPU during use may control the other components of the system to realize the desired functionality of the system. The processors may also execute other software, such as application programs. The application programs may provide user functionality, and may rely on the operating system for lower-level device control, scheduling, memory management, etc. Accordingly, the processors may also be referred to as application processors. The CPU complex 104 may further include other hardware such as an L2 cache and/or an interface to the other components of the system (e.g. an interface to the communication fabric 118).

Generally, a processor may include any circuitry and/or microcode configured to execute instructions defined in an instruction set architecture implemented by the processor. Processors may encompass processor cores implemented on an integrated circuit with other components as a system on a chip (SOC 100) or other levels of integration. Processors may further encompass discrete microprocessors, processor cores and/or microprocessors integrated into multichip module implementations, processors implemented as multiple integrated circuits, etc.

The memory controller 112 may generally include the circuitry for receiving memory operations from the other components of the SOC 100 and for accessing the memory 102 to complete the memory operations. The memory controller 112 may be configured to access any type of memory 102. For example, the memory 102 may be static random access memory (SRAM), dynamic RAM (DRAM) such as synchronous DRAM (SDRAM) including double data rate (DDR, DDR2, DDR3, DDR4, etc.) DRAM. Low power/mobile versions of the DDR DRAM may be supported (e.g. LPDDR, mDDR, etc.). The memory controller 112 may include queues for memory operations, for ordering (and potentially reordering) the operations and presenting the operations to the memory 102. The memory controller 112 may further include data buffers to store write data awaiting write to memory and read data awaiting return to the source of the memory operation. In some embodiments, the memory controller 112 may include a memory cache to store recently accessed memory data. In SOC implementations, for example, the memory cache may reduce power consumption in the SOC by avoiding reaccess of data from the memory 102 if it is expected to be accessed again soon. In some cases, the memory cache may also be referred to as a system cache, as opposed to private caches such as the L2 cache or caches in the processors, which serve only certain components. Additionally, in some embodiments, a system cache need not be located within the memory controller 112.

The peripherals 108A-108B may be any set of additional hardware functionality included in the SOC 100. For example, the peripherals 108A-108B may include video peripherals such as an image signal processor configured to process image capture data from a camera or other image sensor, display controllers configured to display video data on one or more display devices, graphics processing units (GPUs), video encoder/decoders, scalers, rotators, blenders, etc. The peripherals may include audio peripherals such as microphones, speakers, interfaces to microphones and speakers, audio processors, digital signal processors, mixers, etc. The peripherals may include interface controllers for various interfaces external to the SOC 100 (e.g. the peripheral 108B) including interfaces such as Universal Serial Bus (USB), peripheral component interconnect (PCI) including PCI Express (PCIe), serial and parallel ports, etc. The peripherals may include networking peripherals such as media access controllers (MACs). Any set of hardware may be included.

The communication fabric 118 may be any communication interconnect and protocol for communicating among the components of the SOC 100. The communication fabric 118 may be bus-based, including shared bus configurations, cross bar configurations, and hierarchical buses with bridges. The communication fabric 118 may also be packet-based, and may be hierarchical with bridges, cross bar, point-to-point, or other interconnects.

The PMGR 122 may be configured to control the supply voltage magnitudes requested from an external power management unit (PMU, not shown in FIG. 6). The PMGR 122 may be under direct software control (e.g. software may directly request the power up and/or power down of components) and/or may be configured to monitor the SOC 100 and determine when various components are to be powered up or powered down.

It is noted that the number of components of the SOC 100 (and the number of subcomponents for those shown in FIG. 6, such as within the CPU complex 104) may vary from embodiment to embodiment. There may be more or fewer of each component/subcomponent than the number shown in FIG. 6.

Numerous variations and modifications will become apparent to those skilled in the art once the above disclosure is fully appreciated. It is intended that the following claims be interpreted to embrace all such variations and modifications.

What is claimed is:

1. An apparatus comprising:
a first flop configured to launch a first data value responsive to a first clock edge of a clock;
combinatorial logic coupled to the first flop and configured to operate on the first data value to generate a second data value;
a second flop coupled to the combinatorial logic and configured to capture the second data value responsive to the first clock edge; and
a latch coupled to the combinatorial logic and configured to latch an intermediate data value generated by the combinatorial logic responsive to the first data value and prior to completing the second data value, the latch configured to close in response to a second clock edge of the clock during subthreshold voltage operation, wherein the second clock edge is an opposite transition to the first clock edge.

2. The apparatus as recited in claim 1 further comprising a clock gater coupled to a clock input to the latch and coupled to the clock and an enable, wherein the clock gater is configured to disable the clock responsive to the enable being deasserted and to enable the clock responsive to the enable being asserted, wherein the enable is asserted during subthreshold voltage operation.

3. The apparatus as recited in claim 2 wherein the enable is deasserted except during subthreshold voltage operation.

4. The apparatus as recited in claim 2 wherein the latch is open responsive to the clock being disabled.

5. The apparatus as recited in claim 1 wherein the combinatorial logic is configured to further process the intermediate data value output by the latch to generate the second data value.

6. The apparatus as recited in claim 1 wherein the first clock edge is a rising edge and the second clock edge is the falling edge.

7. The apparatus as recited in claim 6 wherein the latch is open during a high phase of the clock, and wherein a clock input to the latch is high continuously except during subthreshold voltage operation.

8. A method comprising:
launching data in an integrated circuit from a first edge-triggered clocked storage device responsive to a first clock edge of a clock in the integrated circuit;
operating on the data in combinatorial logic circuitry coupled to the first edge triggered clocked storage device to generate result data;
capturing the result data in a second edge-triggered clocked storage device responsive to the first clock edge of the clock; and
capturing intermediate data during the operating on the data by the combinatorial logic circuitry, the capturing the intermediate data performed by a latch inserted between the first edge-triggered clocked storage device and the second edge-triggered clock storage device, the latch closing on a second clock edge of the clock that is an opposite clock edge from the first clock edge, the latching preventing incorrect operation when operating the integrated circuit in a subthreshold voltage region.

9. The method as recited in claim 8 further comprising:
disabling the clock to the latch when operating in a non-subthreshold voltage region.

10. The method as recited in claim 9 wherein the clock is at a level at which the latch is open when disabled.

11. The method as recited in claim 9 further comprising:
transitioning to operating in the subthreshold voltage region; and
enabling the clock to the latch responsive to the transitioning.

12. The method as recited in claim 8 wherein the first clock edge is a rising edge and the second clock edge is the falling edge, whereby the latch is open during a time period that the clock is high.

13. The method as recited in claim 8 wherein the first edge-triggered clocked storage device and the second edge-triggered clocked storage device are flops.

14. The method as recited in claim 8 wherein the integrated circuit includes a plurality of circuit blocks, wherein the first edge-triggered storage device, the second edge-triggered storage device, the latch and the combinatorial logic circuitry are in a first circuit block of the plurality of circuit blocks, and the method further comprises:
operating the first circuit block in the subthreshold voltage range during a time that remaining circuit blocks of the plurality of circuit blocks are powered off.

15. An integrated circuit comprising:
a plurality of circuit blocks including a first circuit block having a plurality of latches, the plurality of circuit blocks comprising:
a first plurality of flops;
a second plurality of flops; and
logic circuitry configured to operate on outputs of the first plurality of flops to generate inputs to the second plurality of flops, wherein:
the plurality of latches are configured to latch intermediate values from the logic circuitry responsive to an opposite edge of a clock to a first edge at which the first plurality of flops launches data and the second plurality of flops captures values; and
the first circuit block is configured to operate at a subthreshold supply voltage during a time that remaining circuit blocks of the plurality of circuit blocks are powered down.

16. The integrated circuit as recited in claim 15 wherein the remaining blocks exclude latches that capture intermediate values.

17. The integrated circuit as recited in claim 15 wherein the first edge is a rising edge.

18. The integrated circuit as recited in claim 15 wherein a clock to the plurality of latches is disabled during a second time in which one or more of the remaining circuit blocks are powered up.

19. The integrated circuit as recited in claim 18 wherein the plurality of latches are open when the clock is disabled.

20. The integrated circuit as recited in claim 15 wherein the first circuit block is powered up at any time that the integrated circuit is receiving power.

* * * * *